United States Patent [19]

Lee

[11] Patent Number: 6,078,533
[45] Date of Patent: Jun. 20, 2000

[54] ADJUSTABLE DELAY CIRCUIT FOR SETTING THE SPEED GRADE OF A SEMICONDUCTOR DEVICE

[75] Inventor: Terry R. Lee, Boise, Id.

[73] Assignee: Micron Technology, Boise, Id.

[21] Appl. No.: 09/358,739

[22] Filed: Jul. 21, 1999

Related U.S. Application Data

[62] Division of application No. 08/917,651, Aug. 22, 1997, Pat. No. 5,930,182.

[51] Int. Cl.[7] .................................................. G11C 7/00
[52] U.S. Cl. ............................................................ 365/194
[58] Field of Search .............................. 365/194, 189.02, 365/189.05, 225.7; 327/270, 272, 276–281

[56] References Cited

U.S. PATENT DOCUMENTS

| | | | |
|---|---|---|---|
| 4,953,130 | 8/1990 | Houston | 365/203 |
| 5,001,369 | 3/1991 | Lee | 307/473 |
| 5,097,149 | 3/1992 | Lee | 307/443 |
| 5,229,969 | 7/1993 | Lee et al. | 365/222 |
| 5,229,970 | 7/1993 | Lee et al. | 365/222 |
| 5,231,605 | 7/1993 | Lee | 365/201 |
| 5,276,642 | 1/1994 | Lee | 365/189.04 |
| 5,307,314 | 4/1994 | Lee | 365/189.04 |
| 5,327,317 | 7/1994 | Lee | 361/88 |
| 5,467,041 | 11/1995 | Baba et al. | 327/276 |
| 5,488,580 | 1/1996 | Park | 365/189.05 |
| 5,539,349 | 7/1996 | Roy | 327/276 |
| 5,557,579 | 9/1996 | Raad et al. | 365/226 |
| 5,615,158 | 3/1997 | Ochoa et al. | 365/201 |
| 5,646,564 | 7/1997 | Erickson et al. | 327/158 |
| 5,703,815 | 12/1997 | Kubara et al. | 365/194 |
| 5,748,553 | 5/1998 | Kitamura | 365/230.03 |
| 5,815,462 | 9/1998 | Konishi et al. | 365/233 |
| 5,886,948 | 3/1999 | Ryan | 365/233 |
| 5,930,182 | 7/1999 | Lee | 365/194 |

*Primary Examiner*—Son Mai
*Attorney, Agent, or Firm*—Schwegman, Lundberg, Woessner & Kluth, P.A.

[57] ABSTRACT

An integrated circuit having an adjustable delay circuit such that the timing characteristics of the integrated circuit can be adjusted. A method for adjusting the timing characteristics of the integrated circuit in order to insure that the integrated circuit meets the specifications of a lower speed grade in the event that the integrated circuit fails the specifications of a targeted speed grade.

22 Claims, 4 Drawing Sheets

ADJUSTABLE DELAY CIRCUIT FOR SETTING THE SPEED GRADE OF A SEMICONDUCTOR DEVICE

This application is a Divisional of U.S. Ser. No. 08/917,651, filed Aug. 22, 1997 U.S. Pat. No. 5,930,182.

FIELD OF THE INVENTION

This invention pertains to the field of semiconductor devices; in particular, the invention pertains to a method and apparatus for setting the speed grade of a semiconductor device.

BACKGROUND INFORMATION

In order for an electronic system to operate properly and reliably, the timing specifications of each integrated circuit in the system must be considered and guaranteed. To assist in the design of electronic systems, manufacturers of semiconductor devices categorize their integrated circuits by speed grade, which designates the preferred speed for proper operation. For example, memory devices of conventional microprocessor-based systems may be designated to operate at various speed grades, such as, 66 MHZ or 100 MHZ. Higher speed grade devices are typically sold at a higher price than lower speed grade devices.

Typically, a manufacturer of semiconductor devices tests each integrated circuit as it is produced. If the integrated circuit passes the timing requirements for the targeted speed grade, it is sold at the corresponding price. If the integrated circuit fails, it may be down-graded to a lower speed grade and sold for a lower price. For example, if a memory device fails the timing requirements for operation in a 100 MHZ bus system, it may be downgraded to a lower speed grade for operation in a 66 MHZ bus system and sold at a price lower than the initial target price.

In order to meet the requirements of a particular speed grade, the integrated circuit must meet several different timing specifications. For example, consider a conventional system where a transmitting device is connected to a receiving device by a common bus and the communication between the devices is controlled by a common external clock. For proper communication, it is critical that the transmitting device provide its data to the receiving device no later than a specified time after the previous rising edge of the clock signal. This specified time allows the inputs of the receiving device to stabilize before the next rising edge of the clock when the data is latched by the receiving device. This requirement is known as the output access time of the transmitting device. In order for an integrated circuit to be cataloged at a particular speed grade, the output access time of the integrated circuit must be no greater than output access time specified for that speed grade.

Similarly, the transmitting device must continue to provide the data to the receiving device for a specified time after the rising edge of the clock signal. This requirement, known as the output hold time, ensures that the receiving device has completely latched the communicated data before the transmitting device removes the data from the bus. Therefore, in addition to satisfying the output access time requirement, the output hold time of the transmitting device must be no less than the output hold time required for the speed grade.

Thus, it is possible for an integrated circuit to fail a particular timing specification, such as the output access time, yet meet the other timing specifications such as the output hold time. In some situations, an integrated circuit cannot be sold at the targeted speed grade because it failed the access time requirement and it may not be downgraded because its hold time is too short for operation at the lower speed grade. In this situation, the integrated circuit may not be sold at either speed grade and the manufacturer incurs a loss.

For the reasons stated above, and for other reasons stated below which will become apparent to those skilled in the art upon reading and understanding the present specification, there is a need in the art for an apparatus and method for configuring the timing characteristics of an integrated circuit. There is a need in the art for an integrated circuit which, in the event the integrated circuit fails the timing specifications of the desired speed grade, may be configured to meet the timing specifications of a lower speed grade.

SUMMARY OF THE INVENTION

In order to overcome the problems with the prior art, an integrated circuit is provided having internal device logic for producing a logic signal, an output interface and a delay circuit connected to the device logic and the output interface. The delay circuit generates an output signal by selectively adding delay to the logic signal. A delay control is connected to the delay circuit for selecting the appropriate amount of delay.

According to one aspect of the present invention, a semiconductor memory device is designed with memory control logic and a memory array having a plurality of memory cells for storing data, wherein the memory array produces a logic signal representing the stored data when addressed by the memory control logic. A delay circuit is connected to the memory array, wherein the delay circuit generates an output signal by selectively adding delay to the logic signal. A delay control selects the appropriate delay and an output interface receives the output signal from the delay circuit.

According to another aspect of the present invention, a semiconductor memory device includes memory control logic and a memory array having a plurality of memory cells for storing data, wherein the memory array produces a logic signal representing the stored data when addressed by the memory control logic. A delay element having a fixed time constant receives the logic signal from the output of device logic and provides a delayed version of the logic signal according to the fixed time constant. The integrated circuit further includes a multiplexer having a pair of inputs, a selection input, and an output, one of the inputs receiving the logic signal from the output of the device logic and the other input receiving the delayed version of the logic signal from the delay element, the multiplexer selectively connecting one of the inputs to the output when the selection input is placed in a first state by the delay control and selectively connecting the other of the inputs to the output when the selection input is placed in a second state by the delay control, the output of the multiplexer providing an output signal.

According to yet another aspect of the present invention, a method is described for configuring an integrated circuit in order to meet the timing requirements of a lower speed grade when the integrated circuit failed the timing requirements of a targeted speed grade. The integrated circuit has an output access time and output hold time determined by a delay circuit. The method includes the steps of configuring the delay circuit such that no delay is introduced, and measuring the output access time and the output hold time of the integrated circuit. If the output access time of the integrated circuit is insufficient for the targeted speed grade and the output hold time is insufficient for the lower speed grade, the delay circuit can be adjusted to introduce a delay such that the output hold time and the output access time of the integrated circuit are sufficient for the lower speed grade.

These and other features and advantages of the invention will become apparent from the following description of the preferred embodiments of the invention.

DESCRIPTION OF THE PRESENT INVENTION

In the following detailed description, references are made to the accompanying drawings which illustrate specific embodiments in which the invention may be practiced. Electrical, mechanical, logical and structural changes may be made to the embodiments without departing from the spirit and scope of the present invention. The following detailed description is, therefore, not to be taken in a limiting sense and the scope of the present invention is defined by the appended claims and their equivalents.

Figure 1:
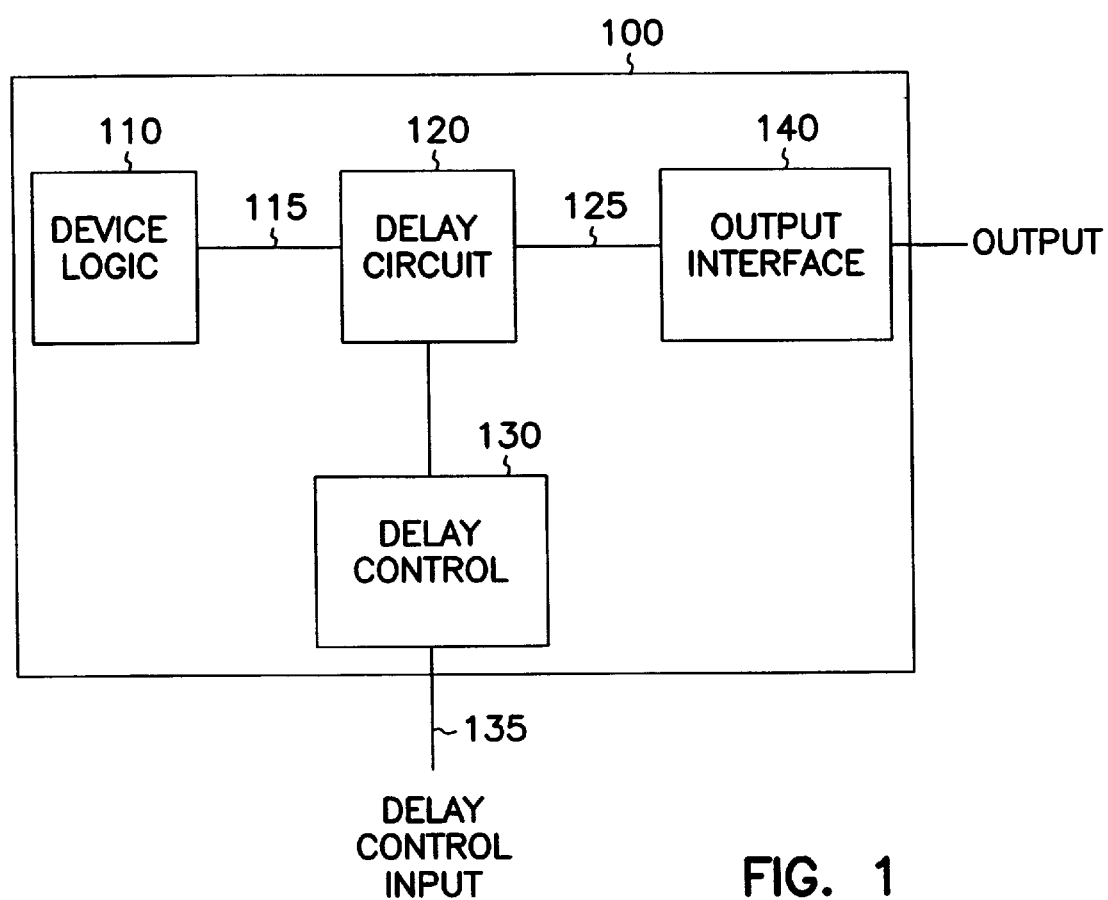
FIG. 1 is a block diagram illustrating one embodiment of an integrated circuit which is configurable for operation at a lower speed grade.

FIG. 1 is a block diagram of one embodiment of an adjustable integrated circuit 100 wherein the output access time, $T_{ac}$, and the output hold time, $T_{oh}$, can be set such that integrated circuit 100 can be configured for a lower speed grade. Integrated circuit 100 includes device logic 110, delay circuit 120, delay control 130 and output interface 140. In one embodiment, integrated circuit 100 is a synchronous dynamic random access memory (SDRAM) and device logic 110 is suitable logic for a memory device such as an address decoder and an array of memory cells.

Device logic 110 represents conventional logic found within an integrated circuit; device logic 110 produces a logic signal on conductor 115. Delay circuit 120 receives the logic signal from conductor 115 and generates an output signal on conductor 125 by selectively adding delay. In this manner, the output signal is a delayed version of the logic signal.

Delay control 130 selects the delay of delay circuit 120 based on timing commands received from delay control input 135. If minimal delay is requested, delay control 130 sets delay circuit 120 such that the delay is nearly zero and the output signal is produced almost immediately from the logic signal. Alternatively, when delay is requested, delay control 130 adjusts delay circuit 120 in order to introduce an appropriate delay. In one embodiment, delay control input 135 is controlled by a signal input into integrated circuit 100 from an external source. In another embodiment, delay control input 135 is a function of the logic states of two or more signal lines. In one such embodiment, the two or more signal lines are used in a normal mode for other functions and in a delay adjustment mode to control the time constant. The state of the two or more signal lines may or may not be stored in a register as part of the delay selection process.

Figure 2:
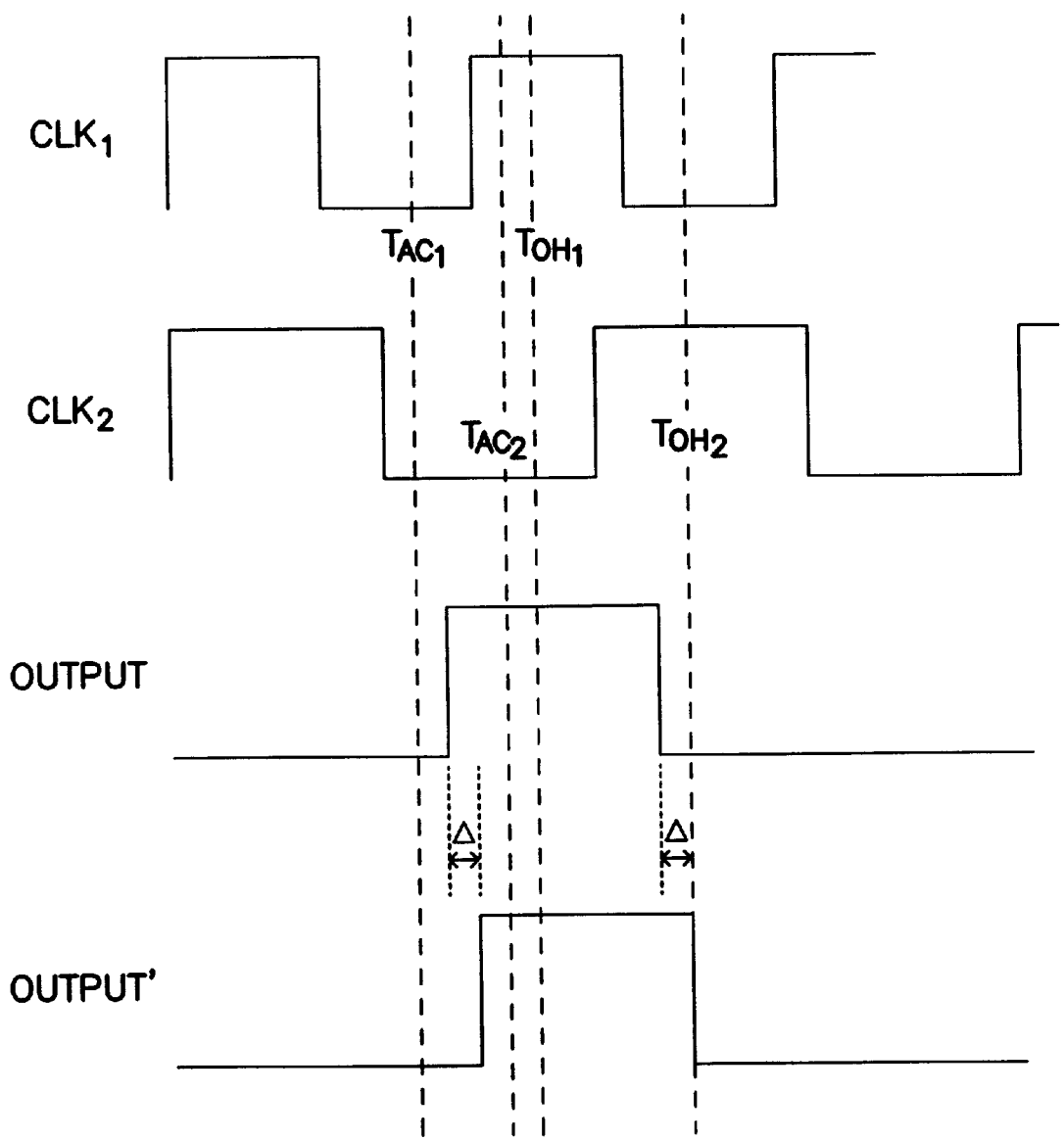
FIG. 2 is a timing diagram illustrating the timing characteristics of an integrated circuit when adjusted for operation at a lower speed grade.

FIG. 2 is a timing diagram illustrating the timing characteristics of integrated circuit 100 before and after the adjustment by delay circuit 120. The first clock signal, $CLK_1$, represents the clock signal corresponding to the targeted speed grade. As illustrated in FIG. 2, in order to operate at the targeted speed grade, integrated circuit 100 must provide its output no later than the output access time, $T_{ac1}$, and must hold its output until the output hold time, $T_{oh1}$. Similarly, the second clock signal, $CLK_2$, represents the clock signal for a lower speed grade. Thus, the period for $CLK_2$ is greater than the period for $CLK_1$. In order for integrated circuit 100 to successfully operate at the lower speed grade, it must provide its output no later than the output access time, $T_{ac2}$, and must hold its output until the output hold time, $T_{oh2}$.

For exemplary purposes, assume the output of an integrated circuit is illustrated by the OUTPUT signal in FIG. 2. In this case, the integrated circuit fails the timing requirements of the target speed grade since its output signal is generated after the output access time, $T_{ac1}$. Therefore, it is desirable to downgrade the speed grade of the integrated circuit and sell for use in application having lower speed requirements. As can be seen in FIG. 2, however, integrated circuit also fails the timing requirements of the lower speed grade since its output signal is removed before the output hold time, $T_{oh2}$. In this situation, a conventional integrated circuit could not be sold at either speed grade and would be discarded. In the case of integrated circuit 100, however, delay control circuit 130 can be commanded to introduce an appropriate delay such that integrated circuit 100 may be sold as a lower speed grade. For instance, in one embodiment of such an integrated circuit 100, timing commands received from delay control input 135 causes delay control 130 to set delay circuit 120 to introduce a specific delay, Δ.

The OUTPUT' signal of FIG. 2 illustrates the output of integrated circuit 100, after delay circuit 120 is adjusted to introduce a delay of Δ. As illustrated in FIG. 2, the integrated circuit 100 meets the timing requirements of the lower speed grade by providing its output before the output access time, $T_{ac2}$, and by holding its output until the output hold time, $T_{oh2}$. In this manner, integrated circuit 100 may now be sold at the lower speed grade and need not be discarded.

Figure 3:
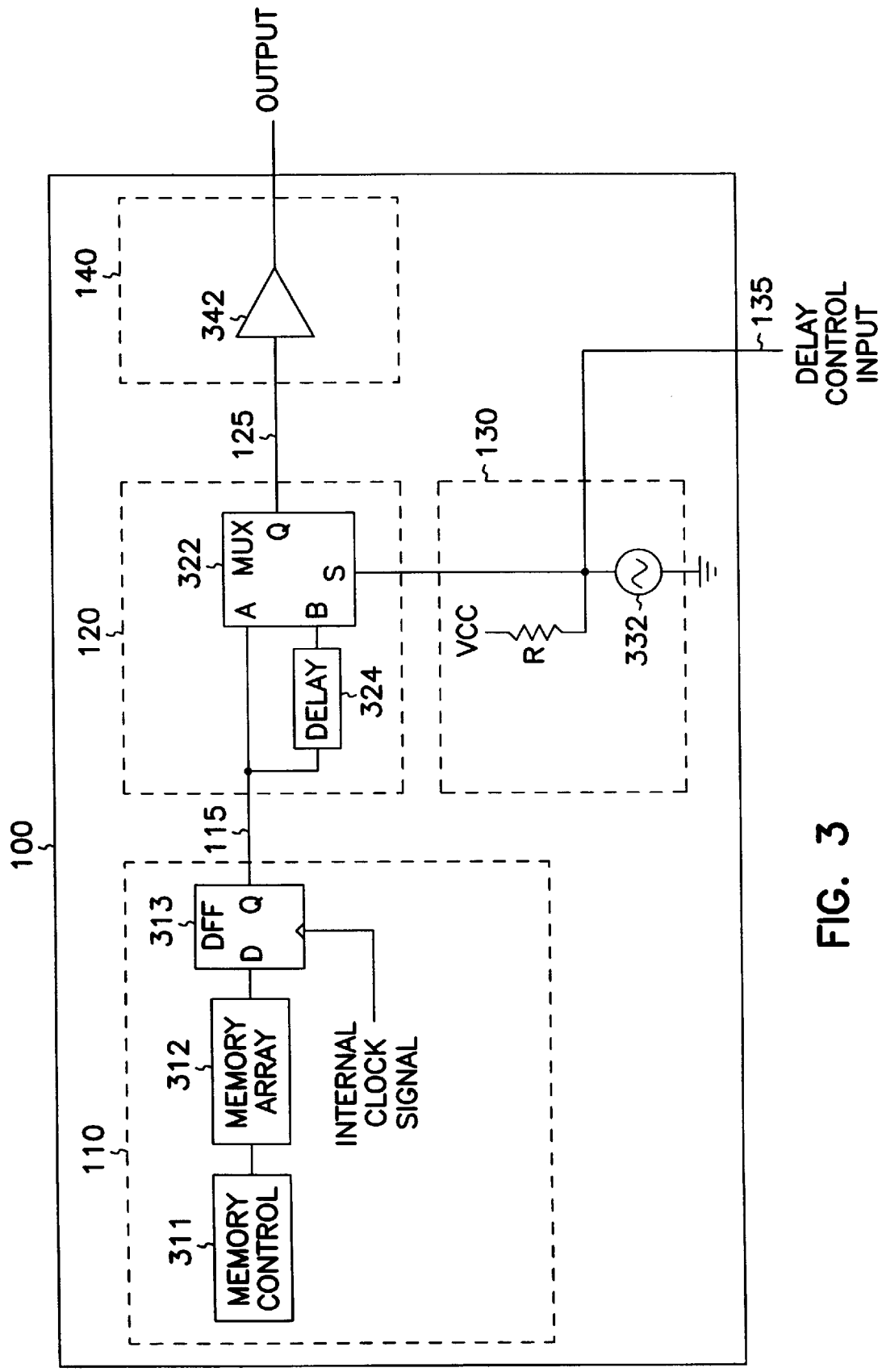
FIG. 3 illustrates one embodiment of an adjustable speed grade integrated circuit having a multiplexer controlled by a fused selection line.

FIG. 3 illustrates one embodiment of adjustable integrated circuit 100 wherein the access time, $T_{ac}$, and the hold time, $T_{oh}$, can be set such that integrated circuit 100 can be used at a lower speed grade. Integrated circuit 100 includes device logic 110, delay circuit 120, delay control 130 and output interface 140. Device logic 110 includes memory control 311 which addresses a plurality of memory cells within memory array 312. The data provided by the memory cells of memory array 312 is provided to flip-flop 313. Flip-flop 313 produces a logic signal representative of the data from memory array 312. Flip-flop 313 provides the logic signal to conductor 115 according to an internal clock signal.

Multiplexer 322 of delay circuit 120 receives the logic signal on conductor 315 via a first input A. The logic signal is also fed to delay element 324 and is subsequently received by a second input, B, of multiplexer 322. Multiplexer 322 selectively couples input A or input B to output Q according to a selection input S. In this manner, output Q of multiplexer 322 produces an output signal which is either identical to the logic signal or a delayed version of the logic signal depending upon selection input S. In another embodiment, integrated circuit 100 uses any conventional switching logic in substitution for multiplexer 322.

In one embodiment, delay control 130 includes fuse 332 which couples the selection input S of multiplexer 322 to ground. In this configuration, multiplexer 322 is in a first state wherein input A is selectively coupled to output Q such that electronic signal passes to output interface 140 with minimal delay. In order to modify the timing characteristics of integrated circuit 100, a bias voltage is applied to delay control input 135 so as to blow fuse 332. When fuse 332 is blown, the voltage present at selection input S of multiplexer 322 is pulled up by resistor R which couples selection input S to Vcc. Once the voltage present at selection input S reaches a predetermined threshold, multiplexer 322 selectively couples input B to output Q such that the delayed version of the logic signal is provided to output 140. Output 140 includes output buffer 342 which receives the output signal provided by delay circuit 120 via conductor 125. Output buffer 342 drives the output signal the output of integrated circuit 100.

Figure 4:
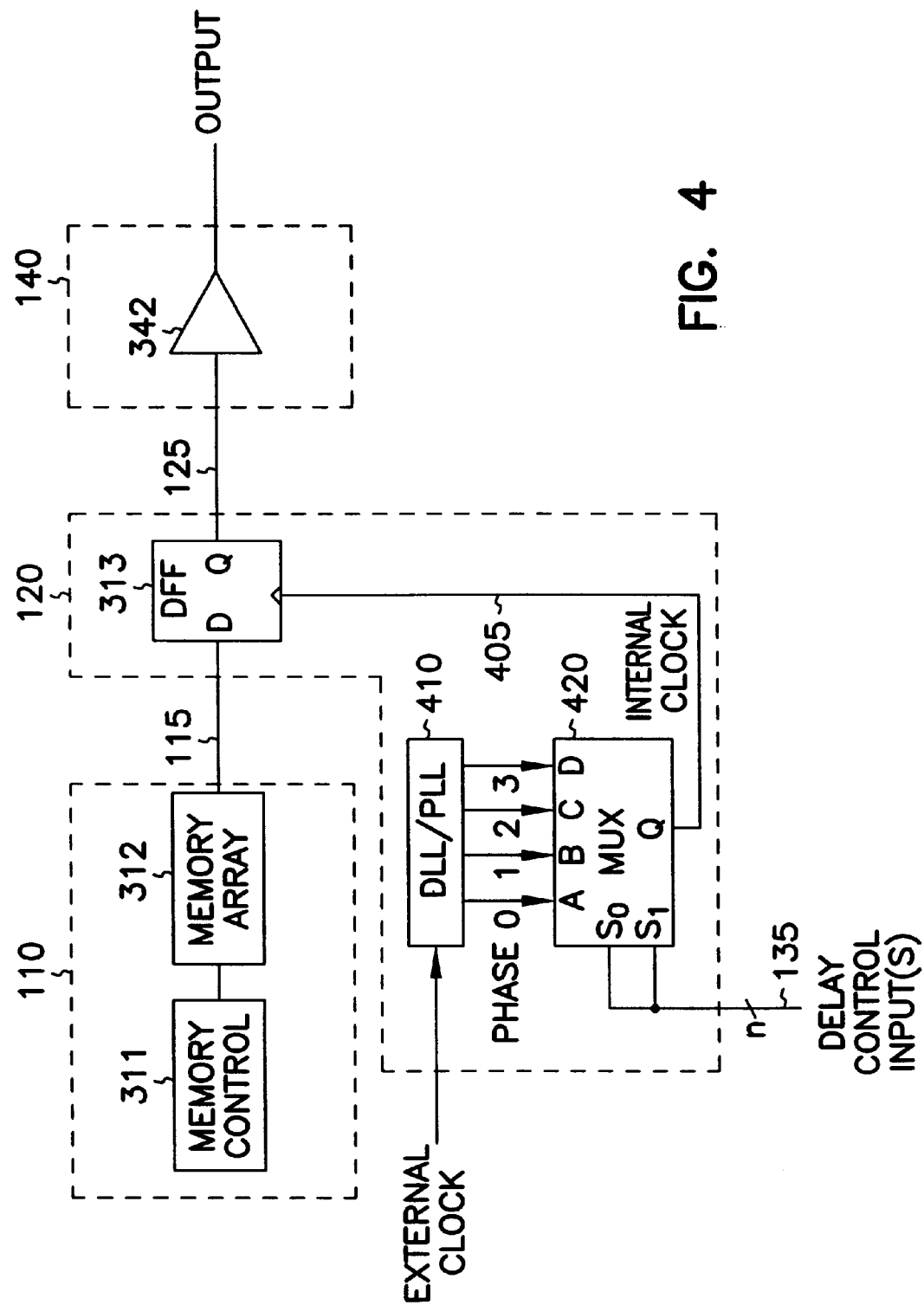
FIG. 4 illustrates one embodiment of an adjustable speed grade integrated circuit which uses a delayed clock to add delay to data read from a circuit such as a memory array.

FIG. 4 illustrates another embodiment of adjustable integrated circuit 100. In FIG. 4, integrated circuit 100 includes device logic 110, delay circuit 120, delay control 130 and output interface 140. Device logic 110 includes memory control 311 which addresses a plurality of memory cells within memory array 312. The data provided by the memory cells of memory array 312 is provided to flip-flop 313 over conductor 115.

In contrast to the embodiment shown in FIG. 3, in FIG. 4 flip-flop 313 is located within delay circuit 120. In this embodiment, therefore, delay circuit 120 includes flip-flop 313, delay 410 and selection circuit 420. In such an embodiment, delay 410 generates one or more delayed clock signals from an external clock. Delay 410 can be implemented, for example, as either a delay-locked loop (DLL) or a phase-locked loop (PLL). In the embodiment shown in FIG. 4, delay 410 is used to generate four separate clock signals. One of the clock signals is then selected by selection circuit 420 and applied to flip-flop 313 via internal clock signal 405. The output of flip-flop 313 can therefore be moved in time to provide a response appropriate for a particular speed grade.

Conclusion

Various embodiments of an integrated circuit having configurable delay circuitry have been described. Such a device may be configured for operation at a lower speed grade in the event that its output access time is too long for the targeted speed grade and its output hold time is too short for the lower speed. In one embodiment, an internal multiplexer is used to select between delayed and non-delayed output. In another embodiment, the multiplexer is controlled by a fuse which may be blown by application of an external voltage to the delay control input. This application is intended to cover any adaptation or variation of the present invention. It is manifestly intended that this invention be limited only by the claims and equivalents thereof.

What is claimed is:

1. A method for configuring an integrated circuit in order to meet the timing requirements of a lower speed grade when the integrated circuit fails the timing requirements of a targeted speed grade, the integrated circuit having an output access time and output hold time determined by a delay circuit, the method comprising:

configuring the delay circuit such that minimal delay is introduced;

measuring the output access time and the output hold time of the integrated circuit; and if the output access time of the integrated circuit is insufficient for the targeted speed grade and the output hold time is insufficient for the lower speed grade, adjusting the delay circuit to introduce a delay such that the output hold time and the output access time of the integrated circuit are sufficient for the lower speed grade.

2. The method for configuring an integrated circuit according to claim 1 wherein adjusting a delay circuit of the integrated circuit includes loading parameters into a programmable register.

3. The method for configuring an integrated circuit according to claim 1 wherein adjusting a delay circuit of the integrated circuit includes supplying a bias voltage of a predetermined magnitude to blow a fuse within the integrated circuit.

4. A method of configuring the speed of an integrated circuit, comprising:

selecting a targeted output access time;

measuring the actual output access time;

adding a delay to the actual output access time if the actual output access time is not within the range of the targeted output access time.

5. A method of configuring the speed of an integrated circuit, comprising:

selecting a targeted output hold time;

measuring the actual output hold time;

adding a delay to the actual output hold time if the actual output hold time is not within the range of the targeted output hold time.

6. A method of configuring the speed of an integrated circuit, comprising:

selecting a targeted output access time and targeted output hold time;

measuring the actual output access time and targeted output hold time;

adding a delay to the actual output access time and the targeted output hold time if the actual output access time or targeted output hold time are not within the range of the targeted output access time or the targeted output hold time.

7. A method of setting the speed grade of an integrated circuit, comprising:

selecting a targeted speed grade;

measuring the actual speed of an integrated circuit;

fusibly adding delay to the actual speed of the integrated circuit if the actual speed is not within the range of the targeted speed grade.

8. A method of introducing delay into an integrated circuit, comprising:

measuring the actual speed of output signals on an integrated circuit;

adding the actual speed with a known delay value to produce a delayed speed value;

comparing the delayed speed value to a plurality of targeted speeds;

selecting one of the plurality of targeted speeds which most closely matches the delayed speed value; and configuring the integrated circuit to operated with the delayed speed value.

9. The method according to claim 8 wherein configuring includes configuring a fuse within the integrated circuit to produce the delayed speed value for the output signals.

10. The method according to claim 9 wherein configuring a fuse includes blowing the fuse to permanently select the delayed speed value on the output signals.

11. A method of setting the timing of output signals of an integrated circuit, comprising:

blowing a fusible link with the integrated circuit; and selecting a predetermined delay value to be permanently added to the output signals of the integrated circuit.

12. A method of setting the output speed of an integrated circuit, comprising:

measuring a speed value of output signals;

determining that the speed value fail to meet timing requirements of a targeted speed grade;

determining that the speed value plus a delay value meets timing requirements of a different speed grade;

configuring a delay circuit to adjust the speed values of the output signals to match the different speed grade.

13. The method according to claim 12 wherein configuring a delay circuit includes configuring a delay circuit within the integrated circuit to add the delay value to the speed value of the output signals.

14. The method according to claim 13 wherein configuring the delay circuit includes configuring a fuse to permanently select the delay value.

15. The method according to claim 13 wherein the delay value is programmed into the integrated circuit from an external input.

16. The method according to claim 13 wherein the delay value is selected from a plurality of possible delay values.

17. A method of configuring an integrated circuit to meet timing requirements of a lower speed grade when the integrated circuit fails to meet timing requirements of a targeted speed grade, comprising:

configuring a delay circuit so that no delay is introduced into output signals of the integrated circuit;

measuring a measured speed of the output signals;

comparing the measured speed to a target speed of a first speed grade;

selecting a delay value which when added to the measured speed will match the target speed of a second speed grade; and configuring the delay circuit to add the delay value to the output signals.

18. The method according to claim 17 wherein measuring further includes measuring the access time or the hold time of the output signals.

19. The method according to claim 17 wherein configuring the delay circuit to add delay includes configuring a fuse to permanently select the delay value.

20. The method according to claim 17 wherein the delay value is programmed into the integrated circuit from an external input.

21. The method according to claim 17 wherein the delay value is selected from a plurality of possible delay values.

22. A method of configuring an integrated circuit to meet timing requirements of a different speed grade when the integrated circuit fails to meet timing requirements of a targeted speed grade, comprising:

configuring a delay circuit so that no delay is introduced into output signals of the integrated circuit;

measuring the output access time and the output hold time of the output signals;

determining that the output access time or the output hold time do not meet the timing requirements of a first speed grade; and configuring the delay circuit to add a delay value to the output access time or the output hold time of the output signals of the integrated circuit to meet the timing requirements of a different speed grade.

* * * * *